United States Patent [19]
Keating et al.

[11] Patent Number: 5,290,761
[45] Date of Patent: Mar. 1, 1994

[54] PROCESS FOR MAKING OXIDE SUPERCONDUCTING FILMS BY PULSED EXCIMER LASER ABLATION

[75] Inventors: Kenneth B. Keating, Wilmington; Stephens S. Thé, Newark, both of Del.

[73] Assignee: E. I. Du Pont de Nemours and Company, Wilmington, Del.

[21] Appl. No.: 963,156

[22] Filed: Oct. 19, 1992

[51] Int. Cl.$^5$ .................... B05D 3/06; B05D 5/12
[52] U.S. Cl. .................... 505/1; 505/732; 505/730; 427/596; 427/126.3; 427/62
[58] Field of Search .................... 505/1, 732, 730; 427/62, 63, 596, 126.3

[56] References Cited

U.S. PATENT DOCUMENTS

| | | | |
|---|---|---|---|
| 5,017,554 | 5/1991 | Subramanian | 505/1 |
| 5,019,552 | 5/1991 | Balooch et al. | 505/1 |

FOREIGN PATENT DOCUMENTS 62-326937 7/1989 Japan .

OTHER PUBLICATIONS

Dijkkamp, P. et al., Appl. Phys. Lett., 51 (8), pp. 619–621, Aug. 24, 1987.
Karen, G. et al, Appl. Phys. Lett., 56(21), pp. 2144–2146, May 21, 1990.
Research Disclosure, 32397, p. 209, Mar. 1991.
Research Disclosure, 32094, p. 985, Dec. 1990.
Koren, G. et al., Appl. Phys. Lett. 55 (23) pp. 2450–2452, Dec. 4, 1989.
Hughes, R. et al., Appl. Phys. Lett. 58 (7) pp. 762–764, Feb. 18, 1991.
Singh, R. et al., Appl. Phys. Lett. 55 (22), pp. 2351–2353, Nov. 27, 1989.
Znotins, T. A., Solid State Tech. pp. 99–104, Sep. 1986.

*Primary Examiner*—Roy King

[57] ABSTRACT

A process for producing thin films of superconducting material by bombarding a heated target with radiation from pulsed high energy UV laser to form a plume of target material, and depositing the plume on a substrate is disclosed.

9 Claims, 5 Drawing Sheets

PROCESS FOR MAKING OXIDE SUPERCONDUCTING FILMS BY PULSED EXCIMER LASER ABLATION

FIELD OF THE INVENTION

This invention relates to manufacture of thin films which can be used as such, or patterned for use as circuit elements.

BACKGROUND OF THE INVENTION

Recent advances in the superconducting transition temperature of various oxide materials has provided the opportunity for applications in radio frequency, microwave and other electronic technologies. Considerable progress has been made in a number of fabrication technologies related to forming these oxide superconductors into various electronic devices.

The technique of laser evaporation for deposition of thin films has been applied to a large class of materials ranging from polymers to semiconductors and dielectrics. For most present electronic device applications such as radio frequency and microwave technology, thin films are proving to be the form of superconducting oxide most useful. As a result, much of the work relating to the use of high temperature superconductors in microelectronic applications has focused on the growth of high quality thin films. Such films can serve as ground planes or can be patterned into a microwave circuit. High quality superconducting films can have significantly lower values of surface resistance than copper or gold films. This low surface resistance is important for making high-performance thin film microwave circuits such as filters, resonators and delay lines.

While various methods are available for producing superconducting thin films, one of the better methods is pulsed laser deposition, described first by D. Dijkkamp at al., Appl. Phys. Lett., 51, 619–621 (1987). This method provides thin films of superconducting material having correct stoichiometry and high superconductivity transition temperature, $T_c$. In addition to the high deposition rate provided by this method and relatively simple apparatus required, the film can be grown at low substrate temperatures, as discussed in Koren et al., Appl. Phys. Lett., 56, 2144–2146 (1990). A major drawback of this technique is that the deposited film contains a large number of particles, commonly referred to as particulates, typically on the order of 0.5 $\mu$m to 2 $\mu$m in width and are commonly present in a density of 110–140 particulates per 1000 $\mu m^2$. The presence of these particulates limits the use of the film in most applications where microscopic patterns must be printed thereon, e.g., microwave circuits. Koren et al. has speculated that these undesirable particulates may result from loosely connected target flakes, splashing of molten material, or deep target subsurface heating that leads to an explosion of bubbles and condensation in the high density plume that results from the laser ablation of the target.

Several techniques have been devised to reduce the size and/or number of particulates in these films. One described by Koren et al. involves the use of a second laser beam perpendicular to the first to reduce the size of the particulates. Another involves using a target that is moved at a velocity comparable to the fragments in order to eject the particulates, Research Disclosure, 32397, March 1991, page 209.

While these methods have met with some success, they involve more expensive and complex apparatus than conventional laser ablation and do not produce sufficiently particulate-free films for demanding applications. The present invention provides a method for producing films wherein the amount of particulates is reduced by orders of magnitude rendering such films of superior utility as circuit elements.

SUMMARY OF THE INVENTION

The present invention provides for a process for producing thin films of superconducting material by bombarding a heated target with radiation from a pulsed high energy UV laser to form a plume of target material and depositing said plume on a substrate. In particular, the present invention provides an improved process for the deposition of superconducting thin film onto a substrate by pulsed laser ablation wherein the improvement comprises heating an ablation target to about 500° C. below its melting point prior to and during ablation. The present invention further comprises a superconducting thin film having a maximum of 10 particulates per 1000 $\mu m^2$ deposited on a substrate.

DETAILED DESCRIPTION OF THE INVENTION

Figure 1:
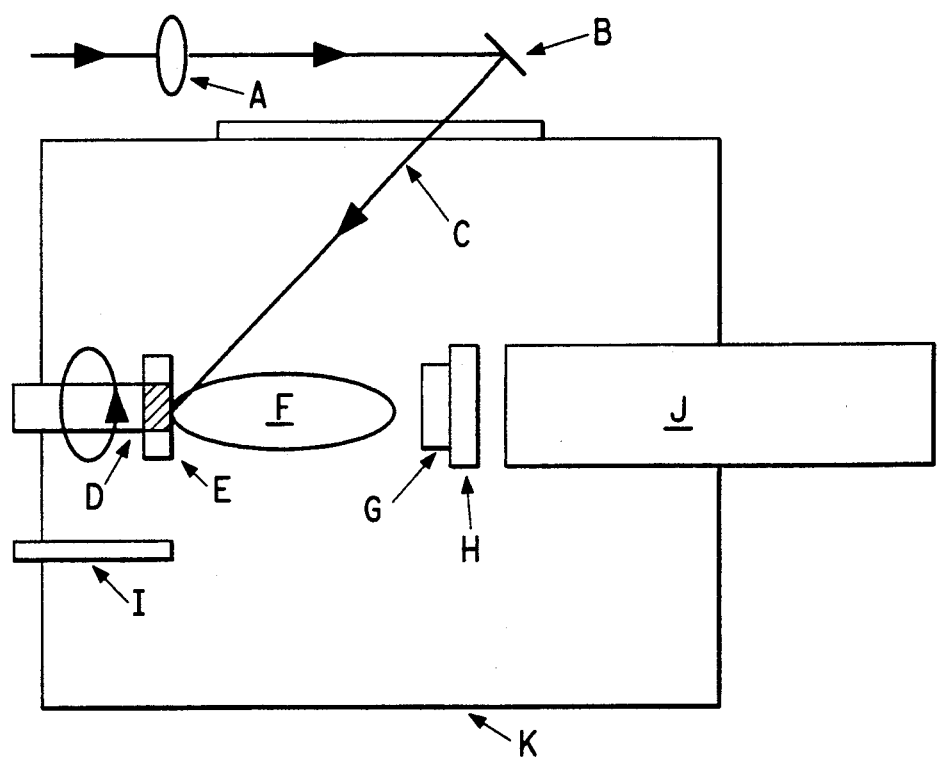
FIG. 1 shows a schematic diagram of a pulsed laser deposition apparatus useful in the practice of the present invention.

The target materials suitable for use in the practice of the present invention include metal oxides. Target materials particularly suitable are copper oxides, preferably superconducting copper oxides. Thus the preferred thin films prepared by the process of the present invention are also superconducting copper oxides. A superconducting material is a material whose resistance decreases to zero at or below a critical temperature and/or becomes perfectly diamagnetic and excludes a magnetic field, this effect being known as the Meissner effect.

Suitable copper oxide superconductors include several types of compounds such as:

(1) rare earth superconductors of the $R_1$-$R_2$-Cu-O, $R_1$-$R_2$-$R_3$-Cu-O, R-Ba-Cu-O, $R_1$-$R_2$-Ba-Cu-O, R-Ca-Cu-O, or $R_1$-$R_2$-Ca-Cu-O types wherein R, $R_1$, and $R_2$ are each independently a rare earth element such as Y, La, Nd, Sm, Eu, Gd, Dy, Ho, Er, Tm, Yb, or Lu;

(2) bismuth superconductors of the Bi-R-Cu-O, Bi-$R_1$-$R_2$-Cu-O or Bi-$R_1$-$R_2$-$R_3$-Cu-O types wherein R, $R_1$, $R_2$, and $R_3$ are each independently Ca, Sr, Y, Pb, or Sb.

(3) thallium superconductors of the Tl-R-Cu-O or Tl-$R_1$-$R_2$-Cu-O types wherein R, $R_1$, and $R_2$ are each independently Ca, Ba, Sr, or Pb.

(4) lead superconductors of the Pb-$R_1$-$R_2$-Cu-O or Pb-$R_1$-$R_2$-$R_3$-Cu-O types wherein $R_1$, $R_2$, and $R_3$ are each independently Sr, Ca, Sb, Ln, Nd, Ba, or Bi.

Preferred for use in the present invention are superconducting compounds of the following types:

(1) rare earth superconductors of the 1-2-3 compound type such as $RD_2Cu_3O_{7-x}$ wherein R is a rare earth such as Y, La, Nd, Sm, Eu, Gd, Dy, Ho, Er, Tm, Yb, or Lu; D is Ba or Sr; and x is 0 to 1. Specific examples include $YBa_2Cu_3O_{7-x}$, wherein x is 0 to 0.3.

(2) superconducting compounds of the formulae $(AO)_xD_2Ca_{n-1}Cu_nO_{2n+2}$ or $(AO)_xD_2Ca_{n-1}Cu_nO_{2n+3}$ wherein A is at least one of Bi, Tl, or Pb; D is Ba or Sr; x is 1 to 2; and n is an integer from 1 to 5. Typically for A is Tl, x is 1 or 2 and for A is Bi, x is 2. Specific examples include $TlBa_2CaCu_2O_7$, $TlBa_2Ca_2Cu_3O_9$, $TlBa_2Ca_3Cu_4O_{12}$, $Tl_2Ba_2CaCu_2O_8$, or $Tl_2Ba_2Ca_2Cu_3O_{10}$.

(3) Superconducting compounds of the formula $Tl_ePb_aCa_bSr_cCu_dO_x$ wherein a is 0.1 to 1.5, b is 1 to 4, c is 1 to 3, d is 1 to 5, e is 0.3 to 1, x is $(a+b+c+d+e+y)$ and y is 0.5 to 3.

(4) Superconducting compounds of the formula $Tl_2Ba_2CuO_{6+x}$ wherein x is 0 to 0.5.

(5) Superconducting compounds of the formula $Bi_2Sr_{3-x}Y_xCu_2O_{8+y}$ wherein x is 0.05 to 0.45 and y is 0 to 1.

Especially preferred materials are superconducting ceramics having a high $T_c$, such as target materials as described in (3) above prepared as described in U.S. Pat. No. 4,894,361 of Subramanian, and those having an atomic ratio of Y:Ba:Cu of a:b:c wherein a is 0.5 to 1.5, b is 1.5 to 2.5, and c is 2.5 to 3.5 prepared in accordance with the procedure described in Bordia, R. K. et al., MRS Symposia Proceedings, Vol. 99, pp. 245-248 (1988). An example of a preferred thin film resulting from this material is $YBa_2Cu_3O_{7-x}$ wherein x is 0 to 0.3. Other preferred thin films are those Of $Tl_ePb_aCa_bSr_cCu_dO_x$ wherein a is 0.1 to 1.5, b is 1 to 4, c is 1 to 3, d is 1 to 5, e is 0.3 to 1, x is $(a+b+c+d+e+y)$, and y is 0.5 to 3.

It is preferred that the target be as dense as possible consistent with the density possible by the method of preparation. A minimum density target of at least about 60% of its crystal specific gravity is preferred, with a more preferred density target of at least about 80% of its crystal specific gravity. Density targets of about 90% or higher are conventionally achievable from known synthetic techniques. The most convenient form of the target is that of a ceramic pellet. The ceramic pellet used for the ablation target can commonly be prepared by mixing oxides of Y, Ba and Cu in the atomic ratio of Y:Ba:Cu of 1:2:3. The resulting mixture is calcined at 600° C. to 900° C. for 1 to 12 hours, ground, and refired under the conditions just described. The resulting material is reground, and pressed into a target disk of about 1 cm diameter and 3 mm thick. This disk is sintered at 700° C. to 900° C. for 1 to 3 hours in an oxygen atmosphere.

In accordance with this invention the target is heated prior to and during exposure to the laser radiation. The target is preferably heated to at least about 500° C. below its melting point, more preferably to about 300° C. below its melting point, and most preferably to 200° C. below its melting point. In the case of $YBa_2Cu_3O_7$, melting preferred that the target be heated to at least about 600° C., and more preferably to at least about 800° C.

FIG. 1 shows a schematic diagram of a pulsed laser deposition apparatus. In FIG. 1 an excimer laser beam is passed through an aperture, then a lens A and reflected from a scanning mirror B through a fused silica window C. to target E heated by heater D. The impingement of the laser beam on target E results in immediate ablation of material from the target in the form of a plasma plume F which is deposited upon substrate G preheated by substrate heater H. J denotes a differentially pumped mass spectrometer and I a dosing value. The entire apparatus is enclosed in a vacuum chamber denoted as K.

The target disk is placed in the vacuum chamber approximately 3 cm from the substrate upon which the film is to be deposited. The laser beam of an excimer laser, for example a Lambda-Physik EMG-201 or a Questek model 2260 248 nm wavelength excimer, then is focused onto the target disk with a pulse energy density (fluence) of at least 1 Joule/cm². The impingement of the laser beam on the disk results in immediate melting and expulsion of material from the target that is deposited on the substrate forming a thin film at the rate of approximately 0.03 nm/pulse. The target is maintained at an elevated temperature within less than about 500° C. of its melting point, preferably less than about 300° C. of its melting point, most preferably less than about 200° C. of its melting point. If the target contains oxygen, the ablation is conducted in an $O_2$ atmosphere of 10-200 mtorr (1.3-26 Pa).

The present invention further comprises a superconducting thin film prepared according to the above-described process of the present invention. The properties of the oxide films formed by laser ablation can be varied by changing the substrate temperature. Deposition onto the substrate at ambient temperature results in an amorphous film of the desired stoichiometry, while deposition onto a substrate heated to very high temperatures (>700° C.) yields films which are a mixture of the crystalline phases of the oxides. Deposition preferably is done above 450° C. to achieve a film which will maintain a good contiguous morphology during the subsequent heating of the film over the range of 820° C. to 950° C. The ablated material is deposited to provide a film having a thickness of 0.1 μm to 2 μm, preferably 0.1 μm to 0.2 μm. A typical film of 0.2 μm thickness will possess less than 10 particulates per 1000 μm² when the target is heated in accordance with this invention.

Substrates useful in the present invention are compatible with formation of the superconductor. Preferred substrates are MgO, $LaAlO_3$, $SrTiO_3$ and yttria-stabilized zirconia (YSZ).

The superconducting film produced by this invention can be fabricated into devices such as resonators, delay lines, filters and other passive devices. The superconducting film also can be combined with semiconductor materials to produce active devices. Devices can be designed into microstrip, stripline and coplanar arrangements. Depending upon use, the superconducting film can be used directly in a circuit device, or alternatively, can be patterned.

Patterning the superconducting film is performed by depositing a photohardenable polymer onto the oxide film. The thickness of the photohardenable polymer film is from 1 μm to 20 μm. The deposited, photohardenable polymer is exposed imagewise to radiation capable of hardening the polymer. If the photohardenable polymer is a negative resist type, the exposed (hardened) polymer constitutes the desired pattern of the oxide superconductor. Subsequent to exposure to radiation, the photohardenable polymer is contacted with a solvent to selectively remove those portions of the polymer film that have not been hardened by radiation to expose the oxide film where oxide superconductor is not wanted. The exposed oxide film is removed with a chemical etchant.

If the photohardenable polymer is a positive resist type, the unexposed polymer forms the desired pattern of the oxide superconductor film. The exposed polymer is contacted with a solvent to selectively remove those portions of the polymer film that are hardened by radiation to expose the oxide film in those regions where oxide superconductor is not wanted. The exposed oxide film is removed with a chemical etchant.

High quality, high resolution (5 $\mu$m wide lines) in the patterned film can be obtained by using positive resist photohardenable polymers. Examples of these polymers include AZ5214-E, a propylene glycol monomethyl ether acetate cresol novolak resin from American Hoecsht Corporation, Rte. 202-206 N., Post Office Box 2500, Somerville, N.J. 08876. Another positive resist useful is KTI 820 from KTI Chemicals Incorporated, 1170 Sonora Court, Sunnyvale, Calif. 94086. Both of these positive resist polymers are developed in basic solutions. A suitable basic solution includes one part of sodium hydroxide in 80 parts $H_2O$, and one part of potassium hydroxide in 80 parts of $H_2O$. The resist is developed for 1 minute in a first bath of the basic solution, for 2 minutes in a second bath of the basic solution, and rinsed in water.

Reactive ion beam etching, as is well known, also can be used to pattern the superconducting films to obtain very fine line widths and excellent feature definition.

The invention will now be described in detail by reference to the following examples.

EXAMPLE 1

Figure 2:
FIGS. 2 and 4 each show a scanning electron micrograph of a thin film prepared in accordance with this invention.

A high density superconducting $YBa_2Cu_3O_7$ pellet was mounted on a modified automobile cigarette lighter heating coil. The target temperature was controlled by adjusting the voltage supplied to the lighter heating coil through a commercially available voltage regulator. In order to produce a target temperature of about 800° C., the voltage was set at 8 volts AC. The substrate onto which the film of superconducting ceramic oxide was deposited was a 500 $\mu$m thick, c-axis oriented single crystal of $LaAlO_3$ heated to 700° C. during the deposition. The target and substrate were placed about 3 cm apart as illustrated in FIG. 1. The target was heated to about 800° C. The ablation was conducted at three different spots on the target each with an ablation area of 1400 $\mu$m $\times$ 1400 $\mu$m using a 248 nm laser beam from a Model 2260 Questek KrF excimer laser. The pulse energy was 295 mJ/pulse at 10 Hz, giving a fluence at the target of 1.2 $J/cm^2$. The first target area was ablated for 10 minutes (or 6000 pulses). The second target area was also ablated for 10 minutes and the last target area for 1 minute. Three separate ablation locations were selected to increase the ablation efficiency and also to allow later scanning electron micrograph (SEM) studies. To maintain a constant temperature of the target, the voltage to the target heater was periodically adjusted. A total of 12000 pulses were deposited. The oxygen pressure in the chamber was held at 100 mtorr (13 Pa) and, after deposition, the substrate with the film deposited thereon was annealed in 760 torr oxygen at 400° C. for 30 minutes, followed by slow cooling to room temperature. The SEM analysis of the film showed that the film was very smooth with a minimal number of particulates, approximately 6 particulates/1000 $\mu m^2$ (FIG. 2). SEM analysis of the target showed that the target had melted and that cone and melted type morphology was observed. The cone shape, however, was very irregular and thin, compared to the previously observed cones on a room temperature target. It was apparent that the cones and droplets at the target had partially melted. Rutherford Backscattering analysis (RBS) of the film showed a composition with the following Y, Ba, and Cu atomic ratios: 0.95 $\pm$ $-0.05$, 2.00 $\pm$ $-0.14$, and 3.05 $\pm$ $-0.13$. (Theoretical ratios: 1.00, 2.00, 3.00.)

COMPARATIVE EXAMPLE A

Figure 3:
FIGS. 3 and 5 each show a scanning electron micrograph of a thin film prepared in accordance with conventional pulsed laser ablation.

The procedure of Example 1 was followed except that the target was not heated prior to or during the deposition. Scanning electron micrographs of the resulting film are shown in FIG. 3. The analysis of the film showed approximately 100–140 particulates/ 1000 $\mu m^2$. Comparison of FIGS. 2 and 3 clearly show the decrease in both the size and number of particulates when the target material is heated prior to and during the deposition process.

EXAMPLE 2

A target high density pellet of superconducting ceramic oxide, $YBa_2Cu_3O_7$ (5.7 g/cc, 90% theoretical density), was mounted onto a modified automobile cigarette lighter heating coil. The target temperature was controlled by adjusting the voltage supplied to the lighter heating coil using a commercially available voltage regulator. The target was heated to 600° C. and maintained at that temperature during the film deposition. The substrate onto which the film of superconducting ceramic oxide was deposited, specifically a 500 $\mu$m thick, c-axis oriented single crystal of $LaAlO_3$, was heated to 700° C. during the deposition. The target and substrate were placed about 3 cm apart in a commercially available pulsed laser deposition chamber using a KrF laser beam at a wavelength of 248 nm. During the deposition, the laser fluence was maintained at 2.5 Joules/$cm^2$ using a Questek Powerlok at 470 mJ/pulse. A total of 12000 pulses (4 sites of 3000 pulses per site) at 10 pulses per second was deposited. The size of the laser ablation was 1200 $\mu$m by 1200 $\mu$m imaged from an aperture near the laser source. The ablation was conducted in an atmosphere of pure oxygen at a pressure of 100 mtorr. After the deposition, the substrate with the film deposited thereon was annealed in 760 torr oxygen at 400° C. for 30 minutes, followed by slow cooling to room temperature. RBS analysis of the film showed an atomic composition of Y, B, Cu to be the following: 0.92$\pm$0.08, 2.00$\pm$0.10, 3.08$\pm$0.11.

Figure 4:

Scanning electron micrographs of the resulting film are shown in FIG. 4.

COMPARATIVE EXAMPLE B

The procedure of Example 2 was followed except that the target was not heated prior to or during the deposition.

Figure 5:
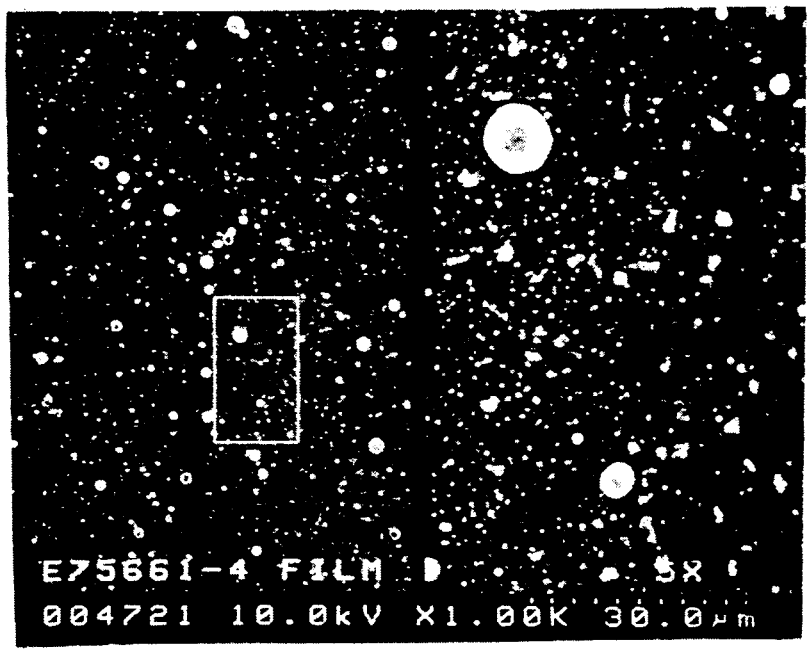

Scanning electron micrographs of the resulting film are shown in FIG. 5. Comparison of FIGS. 4 and 5 clearly shows the decrease in both the size and number of particulates when the target material is heated prior to and during the deposition process.

Other embodiments of the invention will be apparent to those skilled in the art from consideration of the specification, or from practice of the invention disclosed herein. It is intended that the specification and examples be considered as exemplary only, with the scope and spirit of the invention being indicated by the following claims.

What is claimed is:

1. A process for the deposition of an oxide superconducting film onto a substrate by pulsed excimer laser ablation of a target material wherein the improvement comprises heating the target material to within about 500° C. below its melting point prior to an during ablation.

2. The process of claim 1 wherein the target material and the superconducting film each comprises a copper oxide.

3. The process of claim 2 wherein the target material has an atomic ratio of Y:Ba:Cu of a:b:c where a is 0.5 to 1.5, b is 1.5 to 2.5, and c is 2.5 to 3.5.

4. The process of claim 1 wherein the superconducting film comprises $YBa_2Cu_3O_{7-x}$ wherein x is 0 to 0.3.

5. The process of claim 1 wherein the superconducting film is $Tl_ePb_aCa_bSr_cCu_dO_x$ wherein a is 0.1 to 1.5, b is 1 to 4, c is 1 to 3, d is 1 to 5, e is 0.3 to 1, x is (a+b+c+d+e+y) and y is 0.5 to 3.

6. The process of claim 2 wherein the target material is $Tl_ePb_aCa_bSr_cCu_dO_x$ wherein a is 0.1 to 1.5, b is 1 to 4, c is 1 to 3, d is 1 to 5, e is 0.3 to 1, x is (a+b+c+d+e+y), and y is 0.5 to 3.

7. The process of claim 1 wherein the target material is heated to within 200° C. below its melting point prior to ablation.

8. The process of claim 5 performed at or below a pressure of about 26 Pa.

9. The process of claim 1 wherein the substrate is selected from the group consisting of MgO, $LaAlO_3$, $SrTiO_3$, and yttria-stabilized zirconia.

* * * * *